United States Patent
Alfieri

(10) Patent No.: US 9,685,207 B2
(45) Date of Patent: Jun. 20, 2017

(54) SEQUENTIAL ACCESS MEMORY WITH MASTER-SLAVE LATCH PAIRS AND METHOD OF OPERATING

(71) Applicant: NVIDIA Corporation, Santa Clara, CA (US)

(72) Inventor: Robert A. Alfieri, Chapel Hill, NC (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/693,808

(22) Filed: Dec. 4, 2012

(65) Prior Publication Data
US 2014/0153341 A1    Jun. 5, 2014

(51) Int. Cl.
| | | |
|---|---|---|
| G11C 16/04 | (2006.01) | |
| G11C 7/10 | (2006.01) | |
| G06F 17/50 | (2006.01) | |
| G11C 19/00 | (2006.01) | |
| G11C 7/22 | (2006.01) | |

(52) U.S. Cl.
CPC .......... *G11C 7/1087* (2013.01); *G06F 17/505* (2013.01); *G11C 19/00* (2013.01); *G11C 7/1006* (2013.01); *G11C 7/106* (2013.01); *G11C 7/22* (2013.01)

(58) Field of Classification Search
CPC ... G11C 2207/2245; G11C 7/065; G11C 7/12; G11C 7/1087; G11C 7/106; G11C 7/1072; G11C 7/1006; G11C 7/22; G06F 11/267; G06F 1/12
USPC .............. 365/189.05, 233.1, 189.02, 230.02; 370/503
See application file for complete search history.

(56) References Cited

U.S. PATENT DOCUMENTS

| | | |
|---|---|---|
| 3,241,122 A | 3/1966 | Bardell |
| 3,421,026 A | 1/1969 | Herbert |
| 5,305,258 A | 4/1994 | Koshizuka |
| 5,448,257 A | 9/1995 | Margeson, III et al. |
| 5,600,598 A | 2/1997 | Skjaveland et al. |
| 5,694,355 A | 12/1997 | Skjaveland et al. |
| 5,696,990 A | 12/1997 | Rosenthal et al. |
| 5,835,941 A | 11/1998 | Pawlowski |
| 5,867,443 A | 2/1999 | Linderman |
| 5,870,329 A | 2/1999 | Foss |
| 5,949,706 A | 9/1999 | Chang et al. |
| 6,041,008 A | 3/2000 | Marr |
| 6,055,590 A | 4/2000 | Pettey et al. |
| 6,084,856 A | 7/2000 | Simmons et al. |
| 6,163,500 A * | 12/2000 | Wilford et al. .......... 365/230.08 |
| 6,263,331 B1 | 7/2001 | Liu et al. |
| 6,263,410 B1 | 7/2001 | Kao et al. |
| 6,265,894 B1 * | 7/2001 | Reblewski ....... G01R 31/31705 326/16 |

(Continued)

OTHER PUBLICATIONS

Rouse, Margaret; "Cache Memory", Sep. 2005, www.whatis.com.

(Continued)

*Primary Examiner* — David Lam

(57) ABSTRACT

A synchronous sequential latch array generated by an automated system for generating master-slave latch structures is disclosed. A master-slave latch structure includes N/2 rows of master-slave latch pairs, an N/2-to-1 multiplexer and control logic. N is equal to the number of latches that are included in the latch array.

20 Claims, 13 Drawing Sheets

(56) References Cited

U.S. PATENT DOCUMENTS

| | | | |
|---|---|---|---|
| 6,265,922 B1* | 7/2001 | Kirsch | 327/199 |
| 6,304,505 B1 | 10/2001 | Forbes et al. | |
| 6,366,529 B1 | 4/2002 | Williams et al. | |
| 6,400,735 B1 | 6/2002 | Percey | |
| 6,438,024 B1 | 8/2002 | Gold et al. | |
| 6,501,677 B1 | 12/2002 | Rau et al. | |
| 6,646,938 B2 | 11/2003 | Kodama | |
| 6,803,610 B2 | 10/2004 | Koolhaas et al. | |
| 6,885,589 B2 | 4/2005 | Cioaca | |
| 6,987,775 B1 | 1/2006 | Haywood | |
| 7,051,169 B2 | 5/2006 | Ganton | |
| 7,106,098 B1 | 9/2006 | Zack et al. | |
| 7,111,133 B2 | 9/2006 | Ishikawa et al. | |
| 7,283,404 B2* | 10/2007 | Khan et al. | 365/189.05 |
| 7,333,516 B1* | 2/2008 | Sikkink et al. | 370/503 |
| 7,346,861 B1* | 3/2008 | Lee | 716/103 |
| 7,414,903 B2 | 8/2008 | Noda | |
| 7,498,850 B2 | 3/2009 | Hendrickson | |
| 7,499,347 B2 | 3/2009 | Chen et al. | |
| 7,603,246 B2* | 10/2009 | Newcomb et al. | 702/89 |
| 7,613,030 B2 | 11/2009 | Iwata et al. | |
| 7,630,389 B1 | 12/2009 | Alfieri et al. | |
| 7,724,606 B2 | 5/2010 | Osawa et al. | |
| 7,739,538 B2 | 6/2010 | Fee et al. | |
| 7,783,911 B2* | 8/2010 | Chen et al. | 713/401 |
| 8,164,934 B2 | 4/2012 | Watanabe et al. | |
| 8,332,957 B2 | 12/2012 | Hayasaka | |
| 8,363,492 B2 | 1/2013 | Ishino et al. | |
| 8,369,177 B2 | 2/2013 | Hold et al. | |
| 8,453,096 B2 | 5/2013 | Magee et al. | |
| 8,488,360 B2 | 7/2013 | Okuda | |
| 8,565,034 B1 | 10/2013 | Lu et al. | |
| 8,570,818 B2 | 10/2013 | Jung et al. | |
| 8,760,208 B2 | 6/2014 | Dike et al. | |
| 8,830,766 B2 | 9/2014 | Sahu | |
| 2001/0018734 A1 | 8/2001 | Lie | |
| 2002/0089364 A1 | 7/2002 | Goldgeisser et al. | |
| 2003/0025217 A1 | 2/2003 | Song | |
| 2003/0120886 A1 | 6/2003 | Moller et al. | |
| 2005/0128844 A1 | 6/2005 | Yamagami | |
| 2006/0132209 A1 | 6/2006 | Meltzer et al. | |
| 2006/0136656 A1 | 6/2006 | Conley et al. | |
| 2007/0180006 A1 | 8/2007 | Gyoten et al. | |
| 2007/0253263 A1 | 11/2007 | Noda | |
| 2007/0300095 A1* | 12/2007 | Fee | G06F 13/4217 713/400 |
| 2009/0119631 A1 | 5/2009 | Cortadella et al. | |
| 2009/0168499 A1 | 7/2009 | Kushida et al. | |
| 2010/0174877 A1 | 7/2010 | Yagihashi | |
| 2010/0306426 A1 | 12/2010 | Boonstra et al. | |
| 2011/0040906 A1 | 2/2011 | Chung et al. | |
| 2011/0168875 A1 | 7/2011 | Okuda | |
| 2012/0147680 A1 | 6/2012 | Koike | |
| 2012/0163068 A1 | 6/2012 | Houston | |
| 2013/0129083 A1 | 5/2013 | Fujino | |
| 2014/0003160 A1 | 1/2014 | Trivedi et al. | |
| 2014/0056050 A1 | 2/2014 | Yang et al. | |
| 2014/0129745 A1 | 5/2014 | Alfieri | |
| 2014/0156891 A1 | 6/2014 | Alfieri | |
| 2014/0184268 A1 | 7/2014 | Alfieri et al. | |
| 2014/0244921 A1 | 8/2014 | Alfieri et al. | |
| 2014/0354330 A1 | 12/2014 | Gotterba et al. | |
| 2014/0355334 A1 | 12/2014 | Gotterba et al. | |
| 2014/0355362 A1 | 12/2014 | Wang et al. | |
| 2015/0016183 A1 | 1/2015 | Sinangil et al. | |

OTHER PUBLICATIONS

Sakai et al., "Prototype Implementation of a Highly Parallel Dataflow Machine em-4", Parallel Processing Symposium, 1991 Proceedings, Fifth International IEEE, 1991.

"Electronic/Flip Flops" Nov. 29, 2011, Wikibooks, <http://en.wikibooks.org/wiki/Electronics/Flip_Flops>, retrieved Sep. 30, 2014.

"What is the Difference Between Static RAM and Dynamic RAM?", Aug. 24, 2000, HowStuffWorks.com, <http:///computer.howstuffworks.com/question452.htm>Retrieved Sept 29 2014.

* cited by examiner

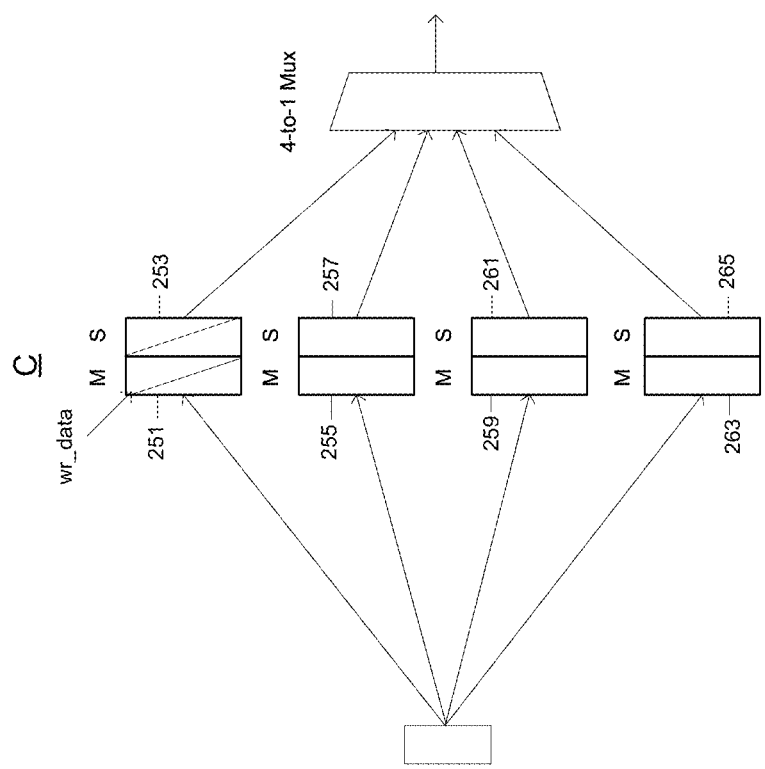

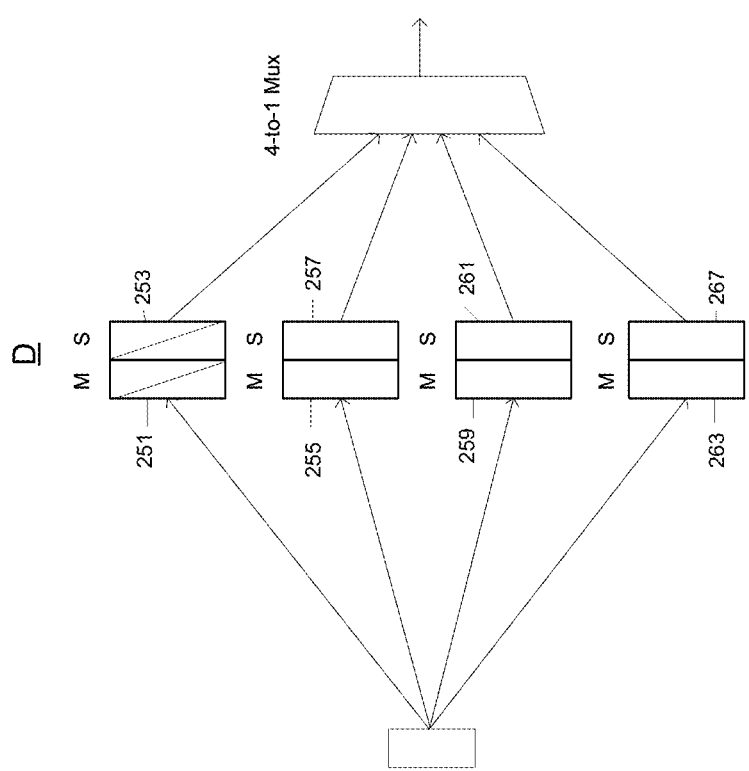

SEQUENTIAL ACCESS MEMORY WITH MASTER-SLAVE LATCH PAIRS AND METHOD OF OPERATING

CROSS-REFERENCE TO RELATED APPLICATION

This application is related to U.S. patent application Ser. No. 13/693,869, filed Dec. 4, 2012, entitled "SYSTEMS AND METHODS FOR AUTOMATICALLY GENERATING MASTER-SLAVE LATCH STRUCTURES WITH FULLY REGISTERED FLOW CONTROL", assigned to the assignee of the present disclosure, which is hereby incorporated herein by reference in its entirety.

BACKGROUND

In electronics, logic synthesis is a computerized process by which a description of a circuit's operation, design and organization is automatically converted into a design implementation that comprises logic gates. Common examples of this process involve the synthesis of designs expressed using hardware description languages (HDLs), including very high speed integrated circuit HDL (VHDL) and Verilog, typically at the register transfer level (RTL), that describe a circuit's operation, design and organization. Typically the synthesis tool takes RTL code, a standard cell library and user defined constraints and produces a gate level representation of the design. In producing the representation, it attempts to best meet the user defined constraints. Logic synthesis is one aspect of electronic design automation (EDA).

Logic synthesis systems can be configured to generate specific types of circuits. For example, a conventional synthesis system that is configured to generate random access memory (RAM) arrays, generates an 8-deep latch array (includes 8 latches) as is shown in FIG. 1 based on user defined descriptions. To best meet the user defined descriptions, this conventional synthesis system is programmed to generate the 8-deep latch array using a master flip-flop that feed into N rows of slave latches, followed by an N-to-1 multiplexor arranged as is shown in FIG. 1. The 8-deep latch array shown in FIG. 1 includes a BIST structure (not shown) that can be used to test the array.

Circuit design characteristics that are used to determine the merits of circuit designs that are generated by logic synthesis systems include testability, circuit area, timing and power. These characteristics can depend on the components that are used to implement the designs. Synthesis systems such as those that generate latch arrays such as is shown in FIG. 1, rely on the use of a master flip-flop and a readout multiplexor for implementation purposes. The use of such components can have negative design consequences. For example, the scale of a design that uses a master flip-flop and an N-to-1 readout multiplexor is limited by the amount of layout area that the master flop and the N-to-1 readout multiplexor occupy. In addition, such designs have timing limitations that are attributable to their use of a flip-flop and an N-to-1 multiplexor. Accordingly, a shortcoming of the latch array designs that are generated by conventional logic synthesis systems is the use of a flip-flop and a readout multiplexor in their implementation.

SUMMARY

Latch arrays generated by some conventional logic synthesis systems include a flip-flop and readout multiplexor that can occupy excessive space. A latch array that is generated by a logic synthesis system that uses latch pairs instead flip flops is disclosed that addresses these shortcomings. However, the claimed embodiments are not limited to implementations that address any or all of the aforementioned shortcomings.

In one embodiment, the latch array that is generated by the logic synthesis system is a synchronous sequential latch array that includes N/2 rows of master-slave latch pairs. In one embodiment, the logic synthesis system that generates the master-slave latch pairs can be invoked from another logic synthesis system that generates first-in-first-out (FIFO) structures based on configuration parameter settings. In one embodiment, the latch array provides fully-registered flow control. In one embodiment, the latch array that is generated utilizes latch pairs instead of the flip flops that are used in designs generated by some conventional logic synthesis systems. The elimination of a flip flop from the design, as compared to designs using such, saves area and latency. The latch array can be scan-tested and thus does not require a test harness which also saves area and improves timing. In addition, the read-out multiplexor can be smaller because it can be N/2 to 1 instead of N to 1. The use of a smaller multiplexor results in less consumption of power.

In one embodiment, a synchronous sequential access latch array generated by an automated system for generating master-slave latch structures is disclosed. A master-slave latch array includes N/2 rows of master-slave latch pairs, an N/2-to-1 multiplexer and control logic. N is equal to the number of addresses or latches that are included in the latch array.

In one embodiment, a method of operating a sequential access memory that includes a master-slave latch pair array is disclosed. The method includes, in a second half of a clock cycle, receiving data into an empty and open master latch in a first row of the master-slave latch pair array, if master-slave latch pairs of other rows are empty or if master-slave latch pairs of other rows are full, or, receiving data into an empty and open master latch of a subsequent row of the master-slave latch pair array if a master latch and a slave latch of a row or rows preceding the subsequent row are full. Additionally, the method includes, in a first half of a cycle subsequent to a clock cycle in which data is received by a master latch in a row of the master-slave latch pair array, receiving data into a slave latch of the row of the master-slave latch pair array and providing access to the data received into the slave latch of the row of the master-slave latch pair array.

In one embodiment, a method of operating a sequential access memory that includes a master-slave latch pair array is disclosed. The method includes receiving data into respective master latches in a second half of first respective clock cycles, wherein data that is received in the second half of the first respective clock cycles is allowed to flow uninhibited from respective master latches to respective corresponding slave latches. Additionally, the method includes receiving data into respective master latches in a second half of second respective clock cycles and providing access to data stored in the respective corresponding slave latches.

BRIEF DESCRIPTION OF THE DRAWINGS

The embodiments of the present invention, together with further advantages thereof, may best be understood by reference to the following description taken in conjunction with the accompanying drawings in which:

FIG. 3C illustrates an operation performed in a method for controlling a sequential access latch array generated by an automated system for generating master-slave latch structures according to one embodiment of the present invention.

FIG. 3D illustrates an operation performed in a method for controlling a sequential access latch array generated by an automated system for generating master-slave latch structures according to one embodiment of the present invention.

It should be noted that like reference numbers refer to like elements in the figures.

DETAILED DESCRIPTION

Figure 1:
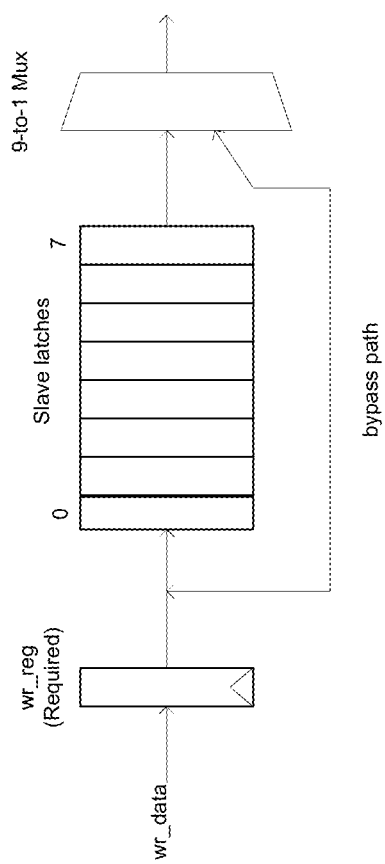
FIG. 1 shows a conventional synthesis system that is configured to generate RAM arrays based on user defined descriptions.

Although the present invention has been described in connection with one embodiment, the invention is not intended to be limited to the specific forms set forth herein. On the contrary, it is intended to cover such alternatives, modifications, and equivalents as can be reasonably included within the scope of the invention as defined by the appended claims.

In the following detailed description, numerous specific details such as specific method orders, structures, elements, and connections have been set forth. It is to be understood however that these and other specific details need not be utilized to practice embodiments of the present invention. In other circumstances, well-known structures, elements, or connections have been omitted, or have not been described in particular detail in order to avoid unnecessarily obscuring this description.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving" or "generating" or "providing access" or the like, refer to the action and processes of a computer system, or similar electronic computing device that manipulates and transforms data represented as physical (electronic) quantities within the computer system's registers and memories and other computer readable media into other data similarly represented as physical quantities within the computer system memories or registers or other such information storage, transmission or display devices.

Figure 2A:
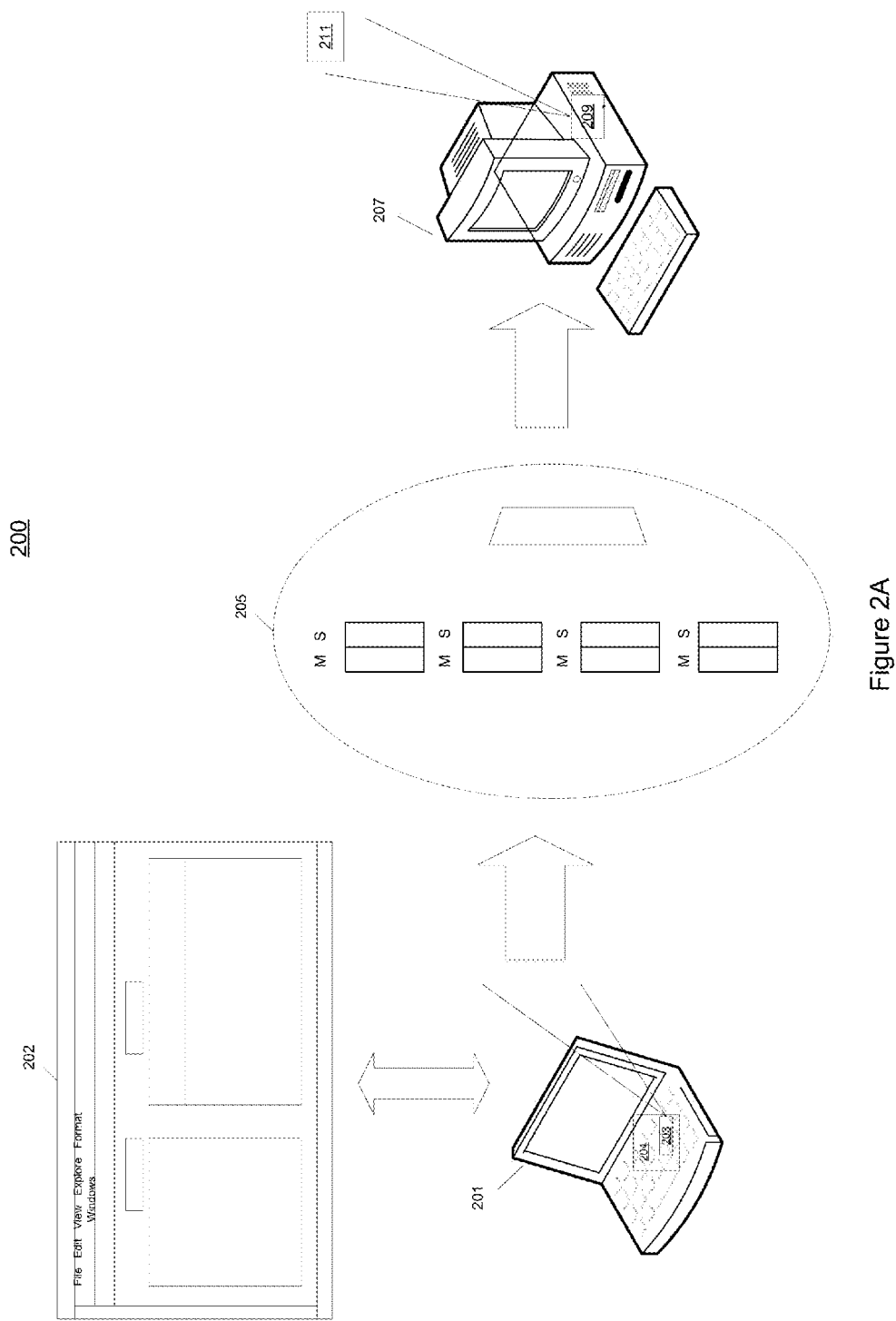
FIG. 2A shows an exemplary operating environment of a sequential access latch array generated by a computer automated system for generating master-slave latch structures according to one embodiment of the present invention.

Exemplary Operating Environment of Sequential Access Memory with Master-Slave Latch Pairs According to One Embodiment FIG. 2A shows an exemplary operating environment 200 of an automated system 203 for generating master-slave latch structures and a physical implementation of a sequential access latch array design 205 generated thereby according to one embodiment. In one embodiment, the latch array that is generated is formed to comprise a plurality of rows of latch pairs. The elimination of a flip flop in the design as compared to designs using such saves area and decreases latency. Furthermore, the latch array can be scan-tested and thus does not require a test harness (which also saves area and improves timing). In addition, an associated read-out multiplexor can be smaller because it can be N/2 to 1 instead of N-to-1 (see FIG. 2B). FIG. 2A shows automated system platform 201, GUI 202, system 203, logic synthesis system or component 204, sequential latch array design 205, computer 207, GPU 209 and sequential access latch array 211.

Referring to FIG. 2A, based on high level design description inputs, system 203 generates a sequential latch array design 205 that comprises N/2 master-slave latch pairs. In one embodiment, system 203 can be invoked from another synthesis system or component 204. In other embodiments, system 203 may not be invoked from another synthesis system or component 204. In one embodiment, the high level design description inputs can include but are not limited to RTL code of the design, constraints on timing, area, etc., and a standard cell library. Moreover, in one embodiment, the high level design description inputs can be input into system 203 via automated system platform 201 (and GUI 202) upon which system 203 operates.

In one embodiment, sequential latch array design 205 is a gate level design representation of a sequential latch array. In one embodiment, sequential latch array design 205 can be physically implemented to form an actual sequential access latch array 211.

In one embodiment, the physically implemented sequential access latch array 211 can be used in GPU 209. For example, in one embodiment, sequential access latch array 211 can be used as a flow control device that controls flow between data sending and data receiving components that are a part GPU 209. In particular, sequential access latch array 211 can be used as an interface between components that work at different speeds or irregularly. This use can prevent a slower operating component from determining the operating speed of other operating components that are involved in a transfer of data. In addition, sequential access latch array 211 can be used to couple peripheral systems to GPU 209. For example, it can be used so that the processing speed of GPU 209 need not be reduced when it exchanges data with a peripheral.

Sequential Access Latch Array

Figure 2B:
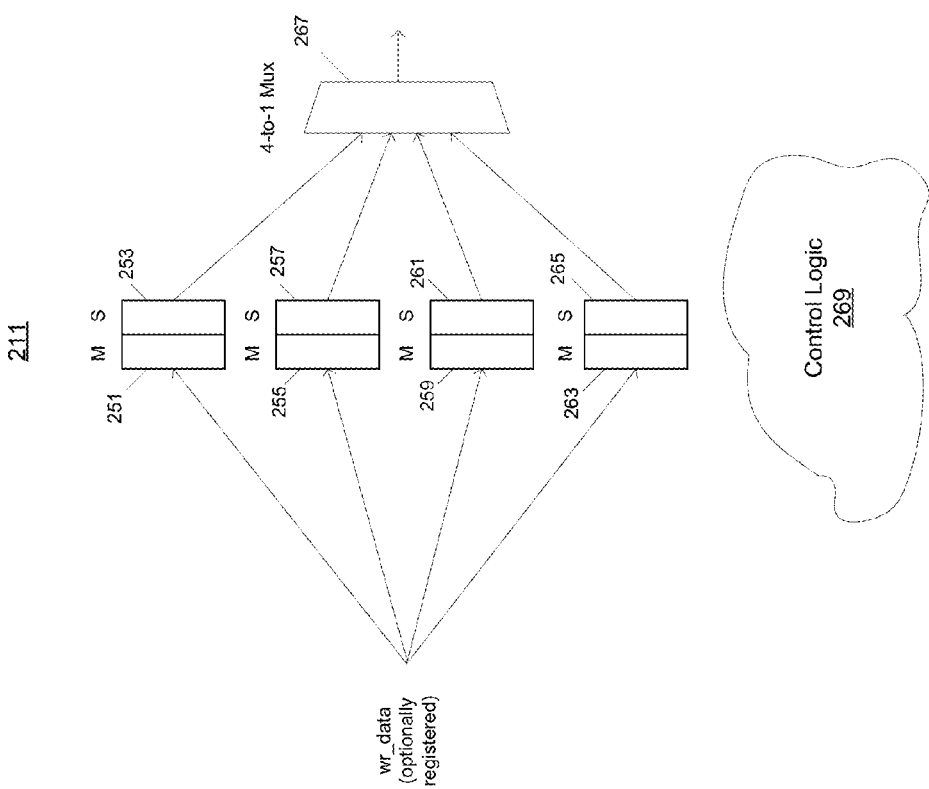
FIG. 2B shows a sequential access latch array according to one embodiment of the present invention.

FIG. 2B shows an exemplary sequential access latch array 211 according to one embodiment. In the FIG. 2B embodiment, sequential access latch array 211 includes first row master-slave pair, 251 and 253, second row master-slave pair, 255 and 257, third row master-slave pair, 259 and 261, fourth row master-slave pair, 263 and 265, N/2-to-1 multiplexor 267 and control logic 269.

Referring to FIG. 2B, in one embodiment, sequential access latch array 211 operates as a first in first out flow control device (e.g., FIFO). In particular, sequential access latch array 211 is configured to receive data inputs from a first electronic component and provide data outputs to another electronic component on a first in first out basis. For example, data inputs to sequential access latch array 211 can be received from an electronic component that writes data to an address of sequential latch array 211 and data outputs from sequential access latch array 211 can be accessed by an electronic component that reads data from sequential access latch array 211. In one embodiment, sequential access latch array 211 can comprise RAM memory addresses that can be accessed by the components.

In the FIG. 2B embodiment, sequential access latch array 211 can include RAM addresses 0-7 where first row master-slave pair, 251 and 253, correspond to RAM addresses 0 and 1, second row master-slave pair, 255 and 257, correspond to RAM addresses 2 and 3, third row master-slave pair, 259 and 261, correspond to RAM addresses 4 and 5, and fourth row master-slave pair, 263 and 265, correspond to RAM addresses 6 and 7. In other embodiments, sequential access latch array 211 can include other numbers of RAM addresses. In one embodiment, master latches of sequential access latch array 211 can be opened during the second half of a clock cycle and slave latches can be opened during the first half of a clock cycle.

In one embodiment, the master and slave latches of sequential access latch array 211 receive data according to rules. In one embodiment, master latch 251 of first row master-slave pair, 251 and 253, can receive data, in a second half of a clock cycle, if master latch 251 is empty and master-slave latch pairs of other rows are empty or if master latch 251 is empty and master-slave latch pairs of other rows are full.

In one embodiment, master latches 255, 259 and 263 of second, third and fourth row master-slave latch pairs can receive data in a second half of a clock cycle, if they are empty and master-slave latch pairs of the preceding row or rows are full.

Slave latches 253, 257, 261 and 265 of the first, second, third and fourth row master-slave latch pairs, when empty, can receive data in the first half of a clock cycle that is subsequent to a clock cycle in which data is received by the corresponding master latch in the row. Rows of the master-slave latch pairs are filled in order from the first row to the fourth.

In another embodiment, respective master latches 251, 255, 259 and 263 of first, second, third and fourth row master-slave latch pairs can receive data in the second half of first respective clock cycles. The received data is allowed to flow uninhibited into the slave latches of the respective master-slave latch pairs. Then, in the second half of second respective clock cycles the empty master latches 251, 255, 259 and 263 can again receive data. In this embodiment, respective master latches of respective master-slave latch pairs are filled, in a round robin manner, in the second half of first and second respective clock cycles. In one embodiment, because the slave latches are transparent, when data is stored in the slave latches of the respective master-slave latch pairs, the data becomes available for readout.

In one embodiment, slave latches of sequential access latch array 211 can be continuously kept open, wherein the data received by the slave latches flow from master latches of sequential access latch array 211 into slave latches of sequential access latch array 211 uninhibited. In this embodiment, power savings can be realized (since the power that is used to open and close the slave latches is saved).

Referring again to FIG. 2B, N/2-to-1 multiplexor 267 (4-to-1 in the FIG. 2B embodiment) selects data that is provided to one of its N/2 inputs and provides it as an output that can be read. In one embodiment, N is equal to the number of addresses in sequential latch array 211. Control logic 269 controls the operations of the sequential access latch array 211. In one embodiment, control logic 211 controls sequential access latch array 211 in accordance with the herein described rules.

Operation

FIGS. 3A-3H illustrates operations performed in a computer implemented method for operating a sequential access latch array generated by an automated system for generating master-slave latch structures according to one embodiment. These operations are illustrated for purposes of clarity and brevity. The operations are described with respect to four cycles 0-4. It should be appreciated that other operations not illustrated in FIGS. 3A-3H can be performed in accordance with one embodiment.

Figure 3A:
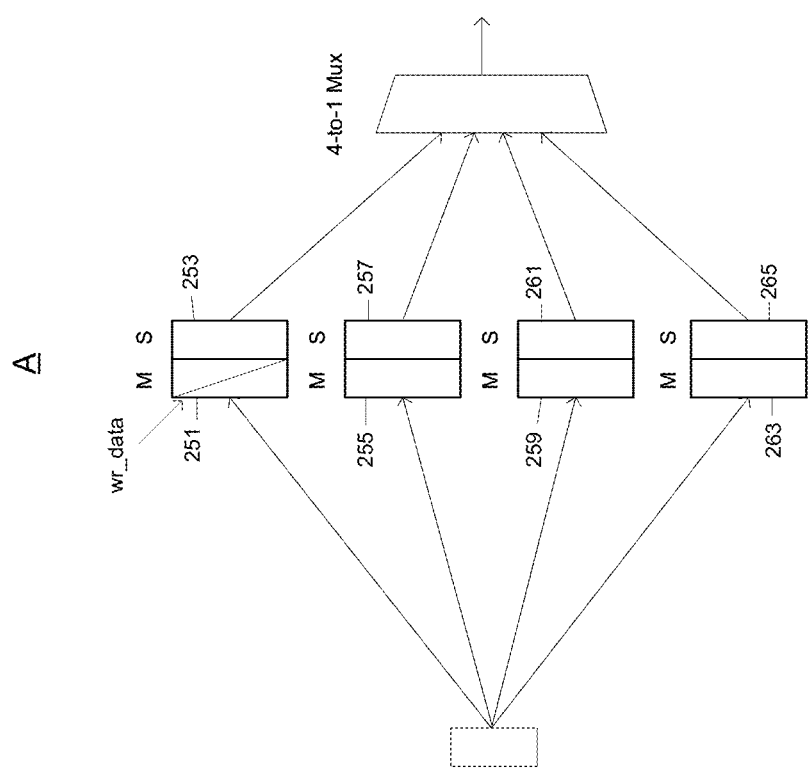
FIG. 3A illustrates an operation performed in a method for controlling a sequential access latch array generated by an automated system for generating master-slave latch structures according to one embodiment of the present invention.

Referring to FIG. 3A, at point A, in the second half of cycle 0 write data (e.g., wr_data as shown in FIG. 3A) is received by master 251 of first row master-slave pair 251-253.

Figure 3B:
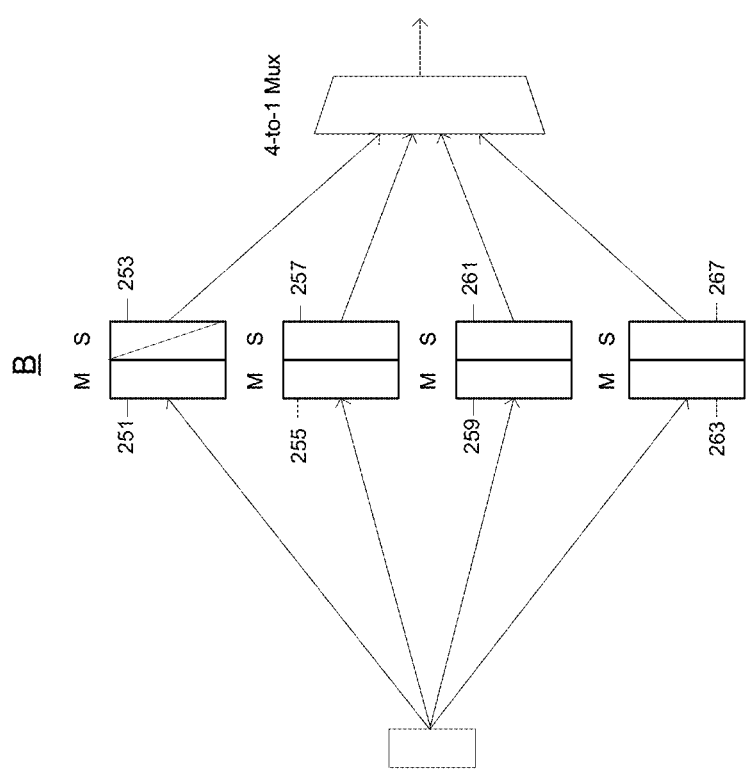
FIG. 3B illustrates an operation performed in a method for controlling a sequential access latch array generated by an automated system for generating master-slave latch structures according to one embodiment of the present invention.

Referring to FIG. 3B, at point B, in the first half of cycle 1 the data that is stored by master 251 (e.g., that which was received in operation A) is provided to slave 253 of first row master-slave pair 251-253.

Referring to FIG. 3C, at point C, in the second half of cycle 1 write data (e.g., wr_data as shown in FIG. 3C) is received by master 251 of first row master-slave pair 251-253.

Referring to FIG. 3D, at point D, in the first half of cycle 2 there is no change from FIG. 3C, as read data is stalled (the data that is available is not being read out from slave 253 of master-slave pair 251-253).

Figure 3E:
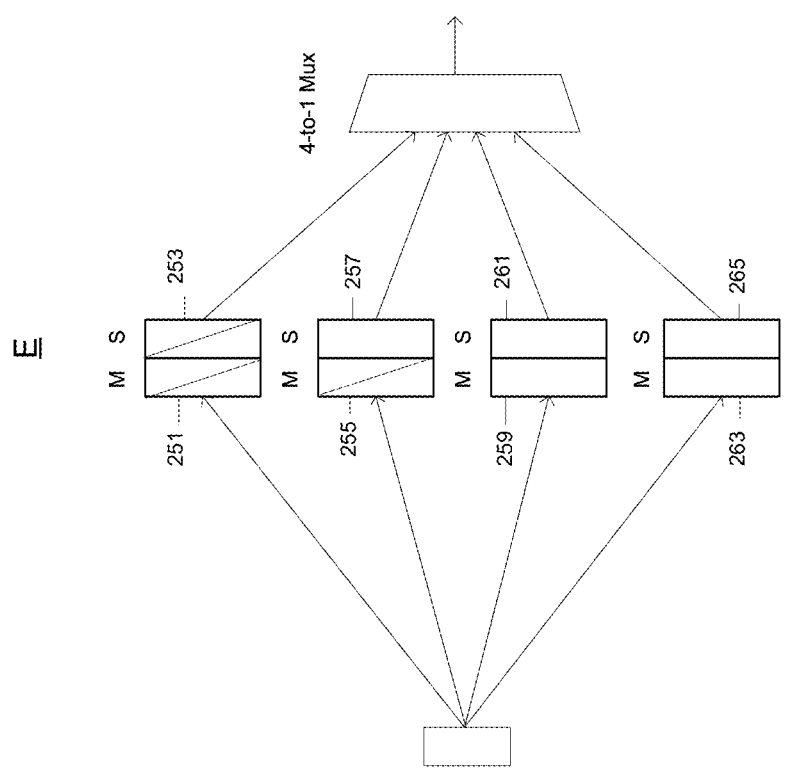
FIG. 3E illustrates an operation performed in a method for controlling a sequential access latch array generated by an automated system for generating master-slave latch structures according to one embodiment of the present invention.

Referring to FIG. 3E, at point E, in the second half of cycle 2 write data (e.g., wr_data as shown in FIG. 3E) is received by master 255 of second row master-slave pair 255-257.

Figure 3F:
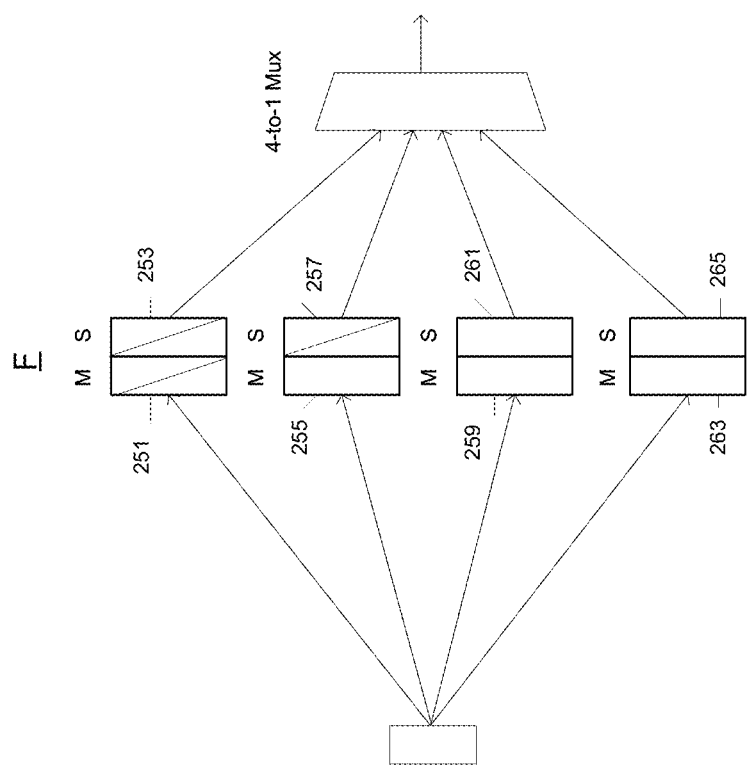
FIG. 3F illustrates an operation performed in a method for controlling a sequential access latch array generated by an automated system for generating master-slave latch structures according to one embodiment of the present invention.

Referring to FIG. 3F, at point F, in first half of cycle 3, the data that is stored by master 255 (that which was received in operation E), is provided to slave 257 of second row master-slave pair 255-257.

Figure 3G:
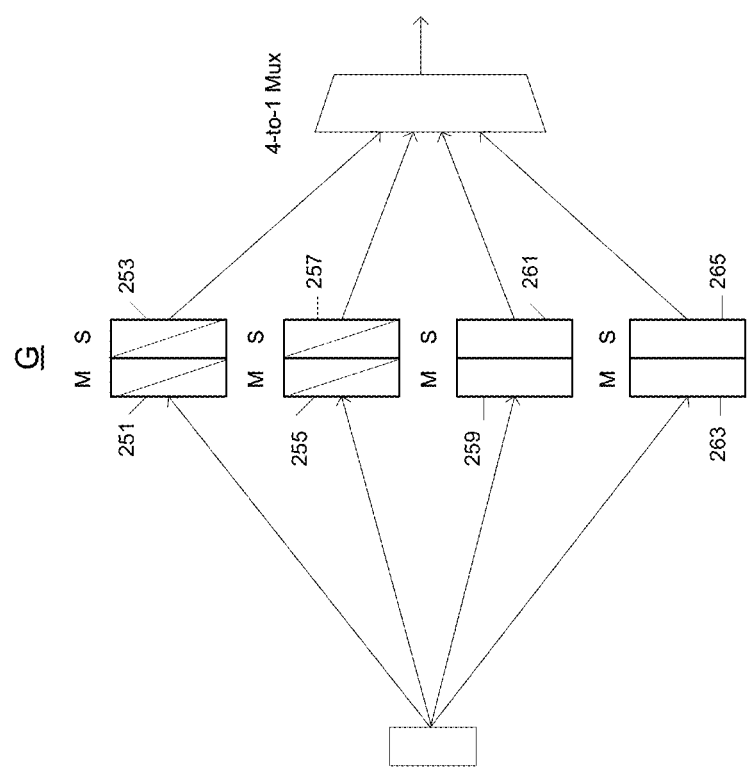
FIG. 3G illustrates an operation performed in a method for controlling a sequential access latch array generated by an automated system for generating master-slave latch structures according to one embodiment of the present invention.

Referring to FIG. 3G, at point G, in second half of cycle 3 write data (e.g., wr_data shown FIG. 3G) is received by master 255 of second row master-slave pair 255-257 (when, for example, a reader is reading the data that is stored in slave 253).

Figure 3H:
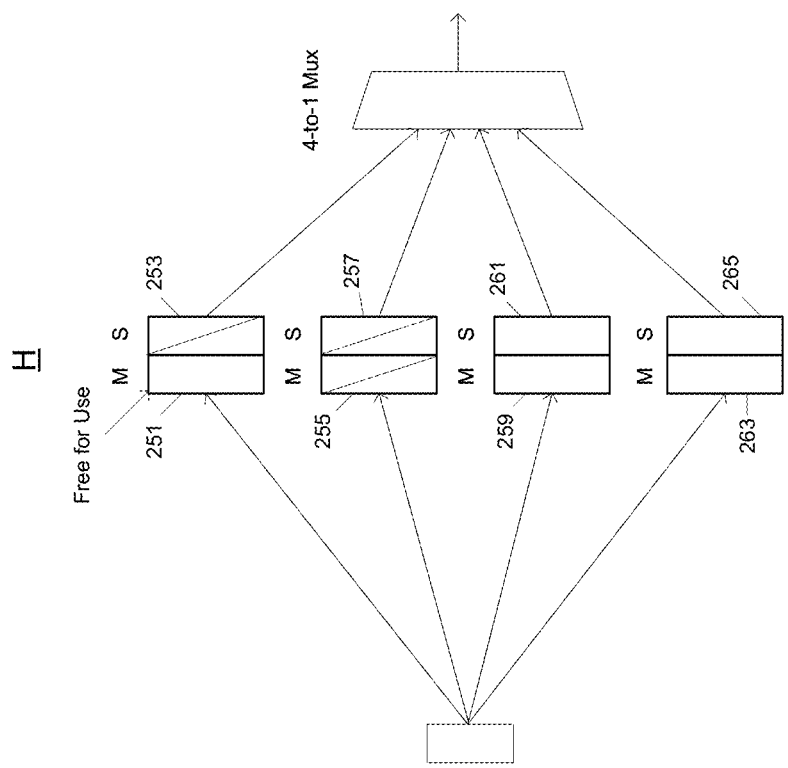
FIG. 3H illustrates an operation performed in a method for controlling a sequential access latch array generated by an automated system for generating master-slave latch structures according to one embodiment of the present invention.

Referring to FIG. 3H, at point H, in the first half of cycle 4, data in master 251 can be provided to slave 253 (and master 251 can be reused if the FIFO is full).

Figure 4:
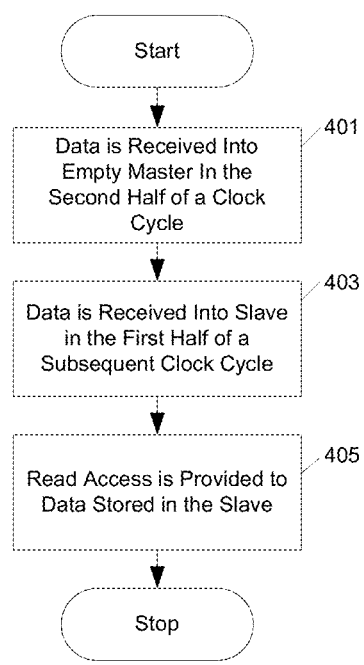
FIG. 4 shows a flowchart of exemplary operations performed in a method for operating a sequential access latch array according to one embodiment of the present invention.
Figure 5:
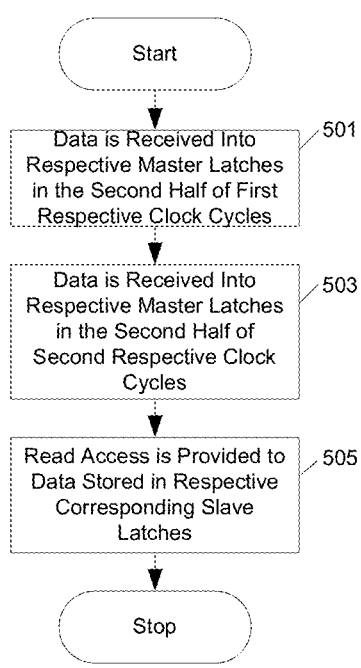
FIG. 5 shows a flowchart of exemplary operations performed in a method of operating a sequential access latch array according to one embodiment of the present invention.

Method of Operating a Sequential Access Memory with Master-Slave Latch Pairs According to One Embodiment FIGS. 4 and 5 show flowcharts 400 and 500 of exemplary computer implemented methods for operating a sequential access latch array (sequential access memory) according to one embodiment. The flowchart includes processes that, in one embodiment can be carried out by processors and electrical components under the control of computer-readable and computer-executable instructions of a computer system. Although specific operations are disclosed in the flowcharts, such operations are exemplary. That is the present embodiment is well suited to performing various other operations or variations of the operations recited in the flowchart.

Referring to FIG. 4, at 401, in a second half of a clock cycle, data is received into an empty master latch in the first row or into an empty master latch of a subsequent row of the sequential access latch array (e.g., master-slave latch pair array). In one embodiment, the data can be received into the empty master latch in the first row, if the empty master latch in the first row of the sequential latch array is open and master-slave latch pairs of other rows are empty or if the empty master latch in the first row of the sequential latch array is open and master-slave latch pairs of other rows are full. In one embodiment, the data can be received into an empty master latch in a subsequent row if a master latch and a slave latch of a row or rows preceding the subsequent row are full.

At 403, in a first half of a cycle, subsequent to a clock cycle in which data is received by a master latch in a row of the sequential access latch array, data is received into a slave latch of that row (if the slave latch is open). And, at 405, read access is provided to the data that is stored in the slave latch.

FIG. 5 shows a flowchart 500 of another exemplary method of operating a sequential access latch array according to one embodiment.

Referring to FIG. 5, at 501, data is received into respective master latches in a second half of first respective clock cycles. In one embodiment the data that is received in the second half of the first respective clock cycles is allowed to flow uninhibited from respective master latches to respective corresponding slave latches.

At 503, data is received into respective master latches in a second half of second respective clock cycles.

At 505, access is provided to data in respective corresponding slave latches.

Table 1 shows an exemplary automatically generated, designer annotated script, that describes a sequential access latch array design generated in accordance with embodiments of the present invention (e.g., sequential latch array design 205 in FIG. 2A).

TABLE 1

Exemplary Automatically Generated Script Describing Sequential Access Latch Array Design with Designer Annotations

```
//
// AUTOMATICALLY GENERATED -- DO NOT EDIT OR CHECK IN
//
// latchgen -m fifo400_latchgen_mspairs_rwsa_8x32 -d 8 -w 32 -s sam -stdout -reset
//
'timescale 1ns/10ps
module fifo400_latchgen_mspairs_rwsa_8x32 (
    clk
    , reset_
    , we
    , wa
    , di
    , ra
    , pop
    , dout
    );
input         clk;
input         reset_;
input         we;
input   [1:0] wa;
input  [31:0] di;
```

TABLE 1-continued

Exemplary Automatically Generated Script Describing Sequential Access Latch
Array Design with Designer Annotations

```
input    [1:0] ra;
input          pop;
output [31:0] dout;
// Sequential Access Memory (SAM) Built Out of 4 Master-Slave Pairs
//
// Each pair holds 2 rows of the SAM.
//
// The trick is to advance the master into the slave when the slave isn't valid
// or when the slave is being popped.    If the slave isn't being popped and we get a new
// item, then we must hold that item in the master until the slave is popped.
//
wire [3:0] we_decode;
wire [3:0] pop_decode;
reg  [3:0] sam_svld;
wire [3:0] sam_mheld;
wire [3:0] sam_we        = (we_decode & (~sam_svld | pop_decode)) | (sam_mheld & pop_decode);
wire [3:0] sam_svld_next = (sam_we & (sam_svld | ~pop_decode)) | (sam_svld & ~pop_decode);
wire [3:0] sam_mhold     = (sam_svld & sam_mheld & ~pop_decode) | (we_decode & sam_svld & ~pop_decode);
always @( posedge clk or negedge reset_ ) begin
     if ( !reset_ ) begin
          sam_svld <= {4{1'b0}};
     end else begin
          sam_svld <= sam_svld_next;
     end
end
assign we_decode[0] = we && wa == 2'd0;
assign pop_decode[0] = pop && ra == 2'd0;
wire [31:0] dout0;
fifo400_latchgen_mspairs_rwsa_8x32_latches rows_0_1 (
     .clk( clk )
   , .reset_( reset_ )
   , .mhold( sam_mhold[0] )
   , .mheld( sam_mheld[0] )
   , .we( sam_we[0] )
   , .di( di )
   , .dout( dout0 )
   );
assign we_decode[1] = we && wa == 2'd1;
assign pop_decode[1] = pop && ra == 2'd1;
wire [31:0] dout1;
fifo400_latchgen_mspairs_rwsa_8x32_latches rows_2_3 (
     .clk( clk )
   , .reset_( reset_ )
   , .mhold( sam_mhold[1] )
   , .mheld( sam_mheld[1] )
   , .we( sam_we[1] )
   , .di( di )
   , .dout( dout1 )
   );
assign we_decode[2] = we && wa == 2'd2;
assign pop_decode[2] = pop && ra == 2'd2;
wire [31:0] dout2;
fifo400_latchgen_mspairs_rwsa_8x32_latches rows_4_5 (
     .clk( clk )
   , .reset_( reset_ )
   , .mhold( sam_mhold[2] )
   , .mheld( sam_mheld[2] )
   , .we( sam_we[2] )
   , .di( di )
   , .dout( dout2 )
   );
assign we_decode[3] = we && wa == 2'd3;
assign pop_decode[3] = pop && ra == 2'd3;
wire [31:0] dout3;
fifo400_latchgen_mspairs_rwsa_8x32_latches rows_6_7 (
     .clk( clk )
   , .reset_( reset_ )
   , .mhold( sam_mhold[3] )
   , .mheld( sam_mheld[3] )
   , .we( sam_we[3] )
```

TABLE 1-continued

Exemplary Automatically Generated Script Describing Sequential Access Latch
Array Design with Designer Annotations

```
        , .di( di )
        , .dout( dout3 )
        );
always @( ra or dout0 or dout1 or dout2 or dout3 ) begin
    case( ra )
        2'd0: dout = dout0;
        2'd1: dout = dout1;
        2'd2: dout = dout2;
        2'd3: dout = dout3;
        // VCS coverage off
        default: dout = {32{1'bx}};
        // VCS coverage on
    endcase
end
endmodule // fifo400_latchgen_mspairs_rwsa_8x32
//
// AUTOMATICALLY GENERATED -- DO NOT EDIT OR CHECK IN
//
// latchgen -m fifo400_latchgen_mspairs_rwsa_8x32_latches -d 1 -w 32 -s rw -
stdout -wr_mhold -wr_mheld -clk_name clk -reset
//
'timescale 1ns/10ps
module fifo400_latchgen_mspairs_rwsa_8x32_latches (
        clk
        , reset_
        , mhold
        , mheld
        , we
        , di
        , dout
        );
input        clk;
input        reset_;
input        mhold;
output       mheld;
input        we;
input  [31:0] di;
output [31:0] dout;
// Master Clock Gate
//
// The master clk gate is a little weird.
// Note that the master latch opens when its clk is low.
// We use NVT_SCKLHQD1 to force the clk high this entire cycle when master
latch data is being held.
// Then we feed that into a CKLNQD12 to hammer it to 0 if the structure is
idle next cycle (to save power).
// So those clock gates are for completely different purposes, but they have
to hammer the clk differently.
//
'ifdef SYNTHESIS
// verilint 630 off
wire mheld_p;
wire mheld_;
wire mclk_gated_p;
wire mclk_gated_en;
wire mclk_gated;
wire TE;
assign mheld = mheld_p;
p_SDFCNQD2 mheld_ff ( .CP(clk), .CDN(reset_), .D(mhold), .Q(mtheld_p) );
INVD2      mheld_inv ( .I(mheld_p), .ZN(mheld_) );
OR2D2      mclk_gate_en_or ( .A1(we), .A2(mtheld), .Z(mclk_gated_en) );
NVT_SCKLHQD1 mclk_gate1 ( .CPN(clk), .E(mheld_), .Q(mclk_gated_p), .TE(TE),
.SE(1'b0), .SI(1'b0), .SO( ) );
CKLNQD12   mclk_gate2 ( .CP(mclk_gated_p), .E(mclk_gated_en), .Q(mclk_gated),
.TE(1'b0) );
// verilint 630 on
'else // fast RTL version
// verilint 410 off - latch is inferred
// verilint 414 off - non-blocking assign in always
reg mheld_p;
always @( posedge clk or negedge reset_ ) begin
    if ( !reset_ ) begin
        mheld_p <= 1'b0;
    end else begin
        mheld_p <= mhold;
    end
end
```

TABLE 1-continued

Exemplary Automatically Generated Script Describing Sequential Access Latch
Array Design with Designer Annotations

```
wire mclk_gated_p = clk || mheld_p;
wire mclk_gated_en = we || mhold;
reg    mclk_gated_en_d;    always    @( mclk_gated_p    or    mclk_gated_en    )    if    (
!mclk_gated_p ) mclk_gated_en_d <= mclk_gated_en;
wire mclk_gated = mclk_gated_p && mclk_gated_en_d;
// verilint 414 on
// verilint 410 on
assign mheld = mheld_p;
'endif // SYNTHESIS
// Slave Clock Gates
//
// Depth is 1, so "wa" is always 0 and "we" applies to only slave gate.
//
wire [0:0] sclk_en = we;
'ifdef SYNTHESIS
wire sclk0_gated; // slave row0 gated
CKLNQD12 sclk0_gate ( .CP(clk), .E(sclk_en[0]), .Q(sclk0_gated), .TE(1'b0) );
'else // fast RTL version
// verilint 410 off - latch is inferred
// verilint 414 off - non-blocking assign in always
reg [0:0] sclk_en_d; always @( clk or sclk_en ) if ( !clk ) sclk_en_d <=
sclk_en;
// verilint 414 on
// verilint 410 on
wire sclk0_gated = clk && sclk_en_d[0];
'endif // SYNTHESIS
// Latch Slice Instances
//
// We lay down a fast-RTL version as well as the gate-level version
'ifdef SYNTHESIS
LATCHSLICE_W1_M1_S1_TP LatchSlice0 (
      .MCP0( mclk_gated )
    , .D0( di[0] )
    , .SCP0( sclk0_gated )
    , .Q0( dout[0] )
    , .SE( 1'b0 )
    , .SI( 1'b0 )
    );
LATCHSLICE_W1_M1_S1_TP LatchSlice1 (
      .MCP0( mclk_gated )
    , .D0( di[1] )
    , .SCP0( sclk0_gated )
    , .Q0( dout[1] )
    , .SE( 1'b0 )
    , .SI( 1'b0 )
    );
. . .
LATCHSLICE_W1_M1_S1_TP LatchSlice31 (
      .MCP0( mclk_gated )
    , .D0( di[31] )
    , .SCP0( sclk0_gated )
    , .Q0( dout[31] )
    , .SE( 1'b0 )
    , .SI( 1'b0 )
    );
'else // fast RTL version
// Latches
//
// verilint 410 off - latch is inferred
// verilint 414 off - non-blocking statement
// use non-blocking assigns to avoid clkedge issues
reg [31:0] di_dly; always @( di ) di_dly <= di;
reg [31:0] dout_mlat; always @( mclk_gated or di_dly ) if ( !mclk_gated )
dout_mlat = di_dly;
reg [31:0] dout_slat0; always @( sclk0_gated or dout_mlat ) if ( sclk0_gated )
dout_slat0 <= dout_mlat;
// verilint 414 on
// verilint 410 on
assign dout = dout_slat0;    // no read-out mux because 1-deep
'endif // SYNTHESIS
// Stub Out Test Ports Using Black Boxes
// Add Observe Flops Where Desired
//
'ifdef SYNTHESIS
NV_BLKBOX_SRC0 latchTestInst_TE ( .Y(TE) );
wire latchTestInst_Observe_mclk_gated_loop;
wire latchTestInst_Observe_mclk_gated_loop_;
```

TABLE 1-continued

Exemplary Automatically Generated Script Describing Sequential Access Latch Array Design with Designer Annotations

```
p_SDFQD2        latchTestInst_Observe_mclk_gated     (   .CP(mclk_gated),
.D(latchTestInst_Observe_mclk_gated_loop_),
.Q(latchTestInst_Observe_mclk_gated_loop) );
INVD2           latchTestInst_Observe_mclk_gated_inv (
.I(latchTestInst_Observe_mclk_gated_loop),
.ZN(latchTestInst_Observe_mclk_gated_loop_) );
// synopsys dc_script_begin
   // set_dont_touch find(cell,"latchTestInst_TE")
   // set_dont_touch find(cell,"latchTestInst_Observe_mclk_gated")
// synopsys dc_script_end
//g2c set_attr preserve 1 [find / -instance "latchTestInst_TE"]
//g2c     set_attr    preserve    1    [find    /    -instance
"latchTestInst_Observe_mclk_gated"]
// synopsys dc_script_begin
   // set_dont_touch find(net,"TE")
// synopsys dc_script_end
'endif // SYNTHESIS
endmodule // fifo400_latchgen_mspairs_rwsa_8x32_latches
```

In one embodiment, the automatic generation of the structure described in Table 1 can be instantiated via a logic synthesis system or component (e.g., 204 in FIG. 2A) as follows:

```
fifo400_latchgen_mspairs_rwsa_8x32 ram (
    .clk( clk )
  , .reset_( reset_ )
  , .di( wr_data )
  , .we( ram_we )      // writing ram this cycle
  , .wa( wr_adr[2:1] ) // does not include lsb of write addr
  , .pop( rd_popping ) // popping fifo this cycle
  , .ra( rd_adr[2:1] ) // does not include lsb of read addr
  , .dout( rd_data )
  );
```

With regard to exemplary embodiments thereof, a synchronous sequential latch array generated by an automated system for generating master-slave latch structures is disclosed. A master-slave latch structure includes N/2 rows of master-slave latch pairs, an N/2-to-1 multiplexer and control logic. N is equal to the number of latches that are included in the latch array.

In one embodiment, master and slave latches of the latch array can be separately enabled. In one embodiment, the latch array provides fully-registered flow control. In one embodiment, the latch array is a FIFO buffer.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

I claim:

1. A synchronous sequential access latch array generated by an automated system for generating master-slave latch structures, said latch array comprising:
   N/2 rows of master-slave pairs of latches that are each operable to receive data inputs from an electronic component, wherein N is equal to the number of addresses that are included in said latch array;
   an N/2 to 1 multiplexer coupled to said N/2 rows of said master-slave pairs; and
   control logic coupled to said N/2 to 1 multiplexer wherein said control logic is operable wherein a data input from said electronic component is received by a master latch of said master-slave pairs, said data input then flows from said master latch in a first half of a clock cycle to a slave latch of said master-slave pairs in a second half of a subsequent clock cycle, said multiplexor operable to select said data input from said slave latch.

2. The latch array of claim 1 wherein said automated system is a logic gate synthesis system that automatically generates master-slave latch structures.

3. The latch array of claim 2 wherein said logic gate synthesis system is invoked from a logic gate synthesis system that generates FIFO structures based on configuration parameter settings.

4. The latch array of claim 1 wherein said control logic is configured to implement data flow to fill latch pairs of respective rows in sequence from row 1 to row N.

5. The latch array of claim 1 wherein said control logic is configured to implement data flow to fill the master latch of respective rows in sequence from row 1 to row N.

6. The latch array of claim 1 wherein master and slave latches of said latch array comprise random access memory (RAM) addresses.

7. The latch array of claim 1 wherein master and slave latches of said latch array are separately enabled.

8. The latch array of claim 1 providing fully-registered flow control.

9. The latch array of claim 1 being a flow control component of a graphics processing unit (GPU).

10. The latch array of claim 1 where N is an even number greater than two.

11. A method of operating a sequential access memory comprising a master-slave latch pair array, said master-slave latch pair array operable to receive data inputs from an electronic component, the method comprising:

in a second half of a clock cycle, receiving a data input from said electronic component into an empty and open master latch in a first row of said master-slave latch pair array, if master-slave latch pairs of other rows are empty or if master-slave latch pairs of other rows are full, or receiving said data input from said electronic component into an empty master latch of a subsequent row of said master-slave latch pair array if a master latch and a slave latch of a row or rows preceding said subsequent row are full;

in a first half of a cycle subsequent to a clock cycle in which said data input is received from said electronic component by a master latch in a row of said master-slave latch pair array, receiving said data input from said master latch into a slave latch of said row of said master-slave latch pair array; and selecting said data input received by said slave latch from said slave latch of said row of said master-slave latch pair array.

12. The method of claim 11 wherein slave latches of said sequential access memory are maintained open and data received by said slave latches flow from master latches of said sequential access memory into said slave latches uninhibited.

13. The method of claim 11 wherein said sequential access memory has N/2 rows where N is an even number greater than two and is equal to the number of addresses in said sequential access memory.

14. The method of claim 11 wherein said selecting comprises using an N/2:1 multiplexor where N is an even number greater than two and is equal to the number of addresses in said sequential access memory.

15. The method of claim 11 wherein said sequential access memory provides fully registered flow control.

16. The method of claim 11 wherein said sequential access memory is a FIFO buffer.

17. The method of claim 11 wherein said sequential access memory is a part of a GPU.

18. A method of operating a sequential access memory comprising a master-slave latch pair array, said master-slave latch pair array operable to receive data inputs from an electronic component, the method comprising:

receiving first data inputs from said electronic component into respective master latches in a second half of first respective clock cycles, wherein said first data inputs received from said electronic component in said second half of said first respective clock cycles are allowed to flow uninhibited from said respective master latches to respective corresponding slave latches;

receiving second data inputs from said electronic component into respective master latches in a second half of second respective clock cycles; and selecting said first data inputs from said respective corresponding slave latches, wherein said sequential access memory has N/2 rows where N is equal to the number of latches in said sequential access memory.

19. The method of claim 18 wherein said selecting comprises using an N/2:1 multiplexor.

20. The method of claim 18 where N is an even number greater than two.

* * * * *